us008351479B2

(12) United States Patent
Lutgen et al.

(10) Patent No.: US 8,351,479 B2
(45) Date of Patent: Jan. 8, 2013

(54) OPTOELECTRONIC SEMICONDUCTOR ELEMENT

(75) Inventors: Stephan Lutgen, Regensburg (DE); Peter Brick, Regensburg (DE); Tony Albrecht, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 236 days.

(21) Appl. No.: 12/293,057

(22) PCT Filed: Mar. 15, 2007

(86) PCT No.: PCT/DE2007/000473
§ 371 (c)(1),
(2), (4) Date: Jan. 26, 2009

(87) PCT Pub. No.: WO2007/118440
PCT Pub. Date: Oct. 25, 2007

(65) Prior Publication Data
US 2009/0304039 A1 Dec. 10, 2009

(30) Foreign Application Priority Data

Apr. 13, 2006 (DE) .......................... 10 2006 017 572
May 23, 2006 (DE) .......................... 10 2006 024 220

(51) Int. Cl.
*H01S 5/183* (2006.01)
*H01S 5/026* (2006.01)
*H01S 5/04* (2006.01)
(52) U.S. Cl. ..................................... 372/50.124; 372/70
(58) Field of Classification Search ................... 372/70, 372/50.124
See application file for complete search history.

(56) References Cited

U.S. PATENT DOCUMENTS

| | | | |
|---|---|---|---|
| 5,513,204 A * | 4/1996 | Jayaraman ...................... | 372/96 |
| 5,774,488 A * | 6/1998 | Kmetec ................................ | 1/1 |
| 5,796,771 A * | 8/1998 | DenBaars et al. .............. | 372/75 |
| 5,879,961 A * | 3/1999 | Scott .............................. | 438/39 |
| 5,914,976 A * | 6/1999 | Jayaraman et al. ........ | 372/50.21 |
| 5,982,802 A | 11/1999 | Thony et al. | |
| 6,404,797 B1 * | 6/2002 | Mooradian ..................... | 372/96 |
| 6,556,610 B1 | 4/2003 | Jiang et al. | |
| 6,973,113 B2 | 12/2005 | Albrecht et al. | |

(Continued)

FOREIGN PATENT DOCUMENTS

DE 199 47 853 4/2000

(Continued)

OTHER PUBLICATIONS

M. Kuznetsov, et al., High Power (>0.5-W CW) Diode-Pumped Vertical-External-Cavity Surface-Emitting Semiconductor Lasers with Circular $TEM_{00}$ Beams, IEEE Photonics Technology Letters, vol. 9, No. 8, Aug. 1997.

*Primary Examiner* — Jessica Stultz
*Assistant Examiner* — Michael Carter
(74) *Attorney, Agent, or Firm* — Cozen O'Connor

(57) ABSTRACT

An optoelectronic semiconductor component has a semiconductor body (1) comprising a surface emitting vertical emitter region (2) comprising a vertical emitter layer (3), at least one pump source (4) provided for optically pumping the vertical emitter layer (3), and a radiation passage area (26) through which electromagnetic radiation (31) generated in the vertical emitter layer leaves the semiconductor body (1), wherein the pump source (4) and the vertical emitter layer (3) are at a distance from one another in a vertical direction.

15 Claims, 11 Drawing Sheets

U.S. PATENT DOCUMENTS

| | | |
|---|---|---|
| 7,529,284 B2 | 5/2009 | Karnutsch et al. |
| 2001/0043629 A1* | 11/2001 | Sun et al. ............ 372/43 |
| 2002/0075929 A1 | 6/2002 | Cunningham |
| 2002/0146053 A1 | 10/2002 | Iwai |
| 2004/0084682 A1 | 5/2004 | Illek et al. |
| 2004/0190567 A1 | 9/2004 | Lutgen et al. |
| 2004/0195641 A1 | 10/2004 | Wirth |
| 2004/0233961 A1* | 11/2004 | Lutgen ............ 372/70 |
| 2005/0036528 A1* | 2/2005 | Schmid ............ 372/36 |
| 2005/0098788 A1 | 5/2005 | Plass et al. |
| 2005/0207461 A1* | 9/2005 | Philippens et al. ........ 372/43.01 |
| 2006/0018354 A1 | 1/2006 | Albrecht et al. |
| 2006/0056473 A1* | 3/2006 | Tanigawa et al. .......... 372/43.01 |
| 2007/0091964 A1 | 4/2007 | Lutgen |
| 2007/0201531 A1 | 8/2007 | Schmid et al. |
| 2007/0217463 A1 | 9/2007 | Albrecht et al. |
| 2008/0080582 A1 | 4/2008 | Karnutsch et al. |

FOREIGN PATENT DOCUMENTS

| | | |
|---|---|---|
| DE | 10223540 A1 | 12/2003 |
| DE | 10 2004 004 781 | 8/2005 |
| DE | 10 2004 042 146 | 1/2006 |
| DE | 10 2005 053 274 | 4/2007 |
| DE | 10 2005 058 237 | 4/2007 |
| EP | 0 821 451 | 1/1998 |
| EP | 1 605 562 | 12/2005 |
| GB | 2 342 773 | 4/2000 |
| TW | 224409 | 11/2004 |
| TW | 244815 | 12/2005 |
| TW | 250708 | 3/2006 |
| WO | WO 01/59895 | 8/2001 |
| WO | WO 2005/048423 | 5/2005 |
| WO | WO 2005/048424 | 5/2005 |

* cited by examiner

OPTOELECTRONIC SEMICONDUCTOR ELEMENT

RELATED APPLICATIONS

This is a U.S. national stage under 35 USC 371 of application No. PCT/DE2007/000473 filed on Mar. 15, 2007.

This patent application claims the priority of German application no. 10 2006 017 572.7 filed Apr. 13, 2006 and of German patent application 10 2006 024 220.3 filed May 23, 2006, the disclosure content of both of which is hereby incorporated by reference.

FIELD OF THE INVENTION

An optoelectronic semiconductor component is disclosed.

BACKGROUND OF THE INVENTION

The document WO 2005/048424A1 describes an optoelectronic semiconductor component.

SUMMARY OF THE INVENTION

One object of the present invention is to provide an optoelectronic semiconductor component in which heat generated during operation can be dissipated to the surroundings particularly efficiently.

In accordance with at least one embodiment of the optoelectronic semiconductor component, the semiconductor component comprises a semiconductor body. The semiconductor body is preferably deposited epitaxially onto a growth substrate.

In accordance with at least one embodiment of the semiconductor component the semiconductor body has a vertical emitter region. The vertical emitter region comprises a vertical emitter layer. The vertical emitter layer forms the active region of the vertical emitter region. The vertical emitter layer is provided for generating electromagnetic radiation. That is to say that the vertical emitter layer generates an electromagnetic radiation field during the operation of the semiconductor component. For this purpose, the vertical emitter layer preferably comprises a quantum well structure, particularly preferably a multiple quantum well structure. In this case, the designation quantum well structure encompasses any structure in which charge carriers can experience a quantization of their energy states as a result of confinement. In particular, the designation quantum well structure does not comprise any indications about the dimensionality of the quantization. It therefore encompasses, inter alia, quantum wells, quantum wires and quantum dots and any combination of these structures.

In accordance with at least one embodiment of the optoelectronic semiconductor component, the semiconductor body comprises at least one pump source. The pump source is provided for optically pumping the vertical emitter layer. The pump source is preferably monolithically integrated into the semiconductor body. Monolithically integrated means that the pump source is grown epitaxially with the vertical emitter region in a common growth process. That is to say that the semiconductor body comprises the epitaxially grown vertical emitter region and also the epitaxially grown pump source.

In accordance with at least one embodiment, the semiconductor body has a radiation passage area. At least part of the electromagnetic radiation generated in the vertical emitter region leaves the semiconductor body through the radiation passage area. The radiation passage area is formed for example by at least one part of a main area of the semiconductor body, said main area preferably running transversely with respect to the growth direction of the semiconductor body. By way of example, the growth direction is perpendicular to the main area.

In accordance with at least one embodiment of the semiconductor component, the pump source and the vertical emitter layer are vertically at a distance from one another. That is to say, in other words, that the pump source is disposed vertically upstream and/or downstream of the vertical emitter layer.

In accordance with at least one embodiment of the optoelectronic semiconductor component, the semiconductor component comprises a semiconductor body. The semiconductor body has a surface emitting vertical emitter region comprising a vertical emitter layer. Furthermore, the semiconductor body has at least one pump source provided for optically pumping the vertical emitter layer. Furthermore, the semiconductor body has a radiation passage area, through which electromagnetic radiation generated in the vertical emitter layer leaves the semiconductor body, wherein the pump source and the vertical emitter layer are at a distance from one another in a vertical direction.

In accordance with at least one embodiment of the semiconductor component, the pump source is arranged between the vertical emitter layer and the radiation passage area. That is to say, in other words, that the pump source is disposed vertically upstream or downstream of the vertical emitter layer, wherein the radiation passage area of the semiconductor body is arranged on that side of the pump source which is remote from the vertical emitter layer. By way of example, the pump source succeeds the radiation passage area in the growth direction of the semiconductor body. The vertical emitter layer then succeeds the pump source in the growth direction of the semiconductor body.

In accordance with at least one embodiment of the optoelectronic semiconductor component, the semiconductor component comprises a semiconductor body. The semiconductor body has a surface emitting vertical emitter region comprising a vertical emitter layer. Furthermore, the semiconductor body has at least one pump source provided for optically pumping the vertical emitter layer. Furthermore, the semiconductor body has a radiation passage area, through which electromagnetic radiation generated in the vertical emitter layer leaves the semiconductor body, wherein the pump source is arranged between the vertical emitter layer and the radiation passage area of the semiconductor body.

In accordance with at least one embodiment of the semiconductor component, the vertical emitter layer is arranged between the pump source and the radiation passage area. That is to say, in other words, that the vertical emitter layer is disposed vertically upstream or downstream of the pump source, wherein the radiation passage area of the semiconductor body is arranged on that side of the vertical emitter layer which is remote from the pump source. By way of example, the vertical emitter layer succeeds the pump source in the growth direction of the semiconductor body. The radiation passage area then succeeds the vertical emitter layer in the growth direction of the semiconductor body.

In accordance with at least one embodiment of the optoelectronic semiconductor component, the semiconductor component comprises a semiconductor body. The semiconductor body has a surface emitting vertical emitter region comprising a vertical emitter layer. Furthermore, the semiconductor body has at least one pump source provided for optically pumping the vertical emitter layer. Furthermore, the semiconductor body has a radiation passage area, through which electromagnetic radiation generated in the vertical emitter layer leaves the semiconductor body, wherein the vertical emitter layer is arranged between the pump source and the radiation passage area of the semiconductor body.

The optoelectronic semiconductor component described here is based, inter alia, on the following: firstly, the described arrangement of vertical emitter layer, pump source and radiation passage area in the semiconductor body makes it possible to embody vertical emitter layer and pump source as layer sequences that are vertically at a distance from one another— for example are successively grown epitaxially. Such a construction enables a multiplicity of possibilities with regard to the choice of the materials and the dimensioning of the regions of the semiconductor body. As a result, by way of example, the wavelength of the pump radiation for optically pumping the vertical emitter layer and/or the wavelength of the radiation emitted vertically by the vertical emitter layer can be set within wide limits.

Furthermore, the construction described makes it possible for the semiconductor body to be thermally connected by the side on which the vertical emitter region is situated, to a heat conducting body—for example a carrier. This enables particularly efficient dissipation of heat generated in the vertical emitter region during the operation of the semiconductor component. By way of example, a temporally particularly stable cw laser operation mode of the optoelectronic semiconductor component is made possible as a result.

In accordance with at least one embodiment of the optoelectronic semiconductor component, the vertical emitter layer is arranged in a mesa of the semiconductor body. That is to say that the semiconductor body is removed in places from one side. This produces a projection—the mesa—in which the vertical emitter layer is situated. By way of example, the mesa is produced in the semiconductor body by means of an etching method. In accordance with at least one embodiment, the vicinity of the mesa is coated at least in places with a material having a particularly good thermal conductivity. That is to say that a material is applied to the semiconductor body in the vicinity of the mesa and, if appropriate, also onto the side area and the top area of the mesa.

Preferably, the material contains at least one metal or the material consists of at least one metal. Preferably, in this case at least one of the following metals is used: copper, gold, silver.

Preferably, the material is applied to the semiconductor body in the vicinity of the mesa in such a way that the material molds over the mesa. That is to say, for example, that the material is applied to that area of the semiconductor body which is remote from the radiation passage area in such a way that the mesa and also the vicinity of the mesa are covered with the material. Preferably, this side of the semiconductor body is then planarized by the material. That is to say, for example, that the material is applied with a thickness such that it has the same height as the mesa or the material projects above the mesa. In this case, it is also possible in particular, for the mesa to be completely enclosed by the material.

Preferably, the semiconductor body is fixed, by the side remote from the radiation passage area, onto a heat conducting body—for example a carrier.

In accordance with at least one embodiment, that side of the semiconductor body which is remote from the radiation passage area has the mesa with the vertical emitter layer and also the vicinity of the mesa in which the semiconductor body has been removed in places, such that for example a contact layer of the pump source is uncovered there.

That is to say that the region between heat conducting body and semiconductor body is then filled with the material at least in places. Preferably, the entire region between semiconductor body and heat conducting body—apart from the mesa—is filled with the material.

In this case, the optoelectronic semiconductor component described here makes use of the idea, inter alia, that a particularly efficient cooling of vertical emitter layer and pump source is made possible by the uncovering of the pump source and the thermal coupling of the pump source and of the mesa containing the vertical emitter layer to the heat conducting body by means of the material. The mesa and also the material surrounding the mesa thus contribute to a further improvement of the heat dissipation during operation of the semiconductor component. By way of example, a temporally particularly constant cw laser operation mode of the semiconductor component is made possible as a result. Preferably, the material has not only its good thermal conductivity but also a particularly good electrical conductivity such that electrical contact can also be made with the pump source by means of the material.

In accordance with at least one embodiment of the optoelectronic semiconductor component, the material is deposited galvanically in the vicinity of the mesa. In this case, the deposited layers can be for example an Ag, Au, or Ag/Au electrodeposition material.

Furthermore, it is also possible for the material to be embodied as a structured heat sink. By way of example, cooling lamellae or other structures which are suitable for enlarging the surface area of the heat sink can then be constructed into the heat sink.

In accordance with at least one embodiment of the optoelectronic semiconductor component, that side area of the semiconductor body which delimits the mesa is provided at least in places so as to direct pump radiation to the vertical emitter layer. Preferably, the side area of the mesa is suitable for reflecting pump radiation in the direction of the vertical emitter layer. That is to say that pump radiation which, coming through the pump source, passes through the vertical emitter layer without being absorbed there is reflected at the side area of the mesa—that is to say the mesa flanks. Reflected pump radiation again enters into the vertical emitter layer. This increases the probability of the absorption of pump radiation in the vertical emitter layer. The pump radiation can therefore be utilized in multiple transit in a targeted manner.

Preferably, the side area of the mesa is coated at least in places—particularly preferably completely—with a material having a reflectivity of at least 80%. The material has the high reflectivity preferably for the wavelength range of the pump radiation. By way of example, the material can be a metal or a layer sequence comprising a transparent passivation layer and a reflective metal layer.

In accordance with at least one embodiment of the optoelectronic semiconductor component, the form of the side area of the mesa is chosen such that the mesa flanks reflect pump radiation Into the vertical emitter layer in a targeted manner. By way of example, the side area of the mesa can be formed at least in places in the manner of one of the following optical basic elements: truncated-cone optical unit, truncated-pyramid optical unit, compound parabolic concentrator (CPC), compound elliptic concentrator (CEC), compound hyperbolic concentrator (CHC). That is to say that the mesa is formed at least in places in the manner of a truncated cone, a truncated pyramid, a paraboloid, an ellipsoid, a hyperboloid or in similarly shaped fashion.

In accordance with at least one embodiment of the optoelectronic semiconductor component, the vertical emitter region comprises a Bragg mirror structure. Preferably, the Bragg mirror structure is arranged on that side of the vertical emitter layer which is remote from the pump source. Particularly preferably, the Bragg mirror structure is free of doping material.

In this case, the optoelectronic semiconductor component described here makes use of the insight, inter alia, that an undoped Bragg mirror structure significantly reduces the absorption of free charge carriers—for example from the vertical emitter layer—by comparison with a doped Bragg mirror structure. As a result—compared with a doped Bragg mirror structure—the efficiency of the generation of radiation in the vertical emitter layer can be increased by at least a factor of two.

In accordance with at least one embodiment of the optoelectronic semiconductor component, the component comprises at least one further mirror which together with the Bragg mirror structure forms a laser resonator for the electromagnetic radiation generated in the vertical emitter layer. By way of example, the mirror can be an external mirror that is not monolithically integrated with the semiconductor body. That is to say that the mirror is then for example not grown epitaxially with the other regions of the semiconductor body. However, it is also possible for the further mirror to be a Bragg mirror structure that is monolithically integrated into the semiconductor body. The further Bragg mirror structure can then be arranged on that side of the pump source which is remote from the radiation passage area or that side of the pump source which faces the radiation passage area.

In accordance with at least one embodiment of the optoelectronic component, an optical element that is in thermal contact with the semiconductor body is arranged in the laser resonator. That is to say that the optical element serves at least for two functions. Firstly, the optical element has specific optical properties and is thus provided for optically manipulating the electromagnetic radiation circulating in the resonator. Secondly, the optical element serves as a heat spreader that is in thermal contact with the semiconductor body. In this way, the optical element contributes to a further improvement of the heat management of the semiconductor component. By way of example, the optical element is fixed onto the radiation passage area of the semiconductor body.

In accordance with at least one embodiment, the optical element has at least one of the following optical properties: frequency-selective, frequency-multiplying, reflective, optically refractive. By way of example, the optical element can be one of the following optical elements: etalon, birefringent filter, optically nonlinear crystal, mirror, lens.

In accordance with at least one embodiment, the optical element contains or consists of one of the following materials: diamond, silicon carbide (SiC). In this case, the optical element preferably has a thickness in the direction of the electromagnetic radiation emerging from the semiconductor body of between 20 micrometers and 70 micrometers, preferably of between 30 micrometers and 60 micrometers. In this case, the optical element forms for example a diamond or silicon carbide etalon. That is to say that the optical element can be formed such that it is correspondingly reflective.

In accordance with at least one embodiment of the optoelectronic semiconductor component, an optically nonlinear crystal is arranged in the resonator of the semiconductor component. In this case, the optically nonlinear crystal can be the optical element that is in thermal contact with the semiconductor body. However, it is also possible for the optically nonlinear crystal to be an additional optical element arranged at a distance from the semiconductor body in the laser resonator. Preferably, the optically nonlinear crystal is provided for the frequency conversion of at least part of the electromagnetic radiation circulating in the resonator.

In accordance with at least one embodiment of the laser device, the optically nonlinear crystal comprises at least one of the following crystals: lithium triborate, e.g. $LiB_3O_5$ (LBO), bismuth triborate, e.g. $BiB_3O_6$ (BiBO), potassium titanyl phosphate $KTiOPO_4$ (KTP), magnesium oxide-doped congruent lithium niobate, e.g. $MgO:LiNbO_3$ (MgO:LN), magnesium oxide-doped stoichiometric lithium niobate, e.g. $MgO:s-LiNbO_3$ (MgO:SLN), magnesium oxide-doped stoichiometric lithium tantalate, e.g. $MgO:LiTaO_3$ (MgO:SLT), stoichiometric $LiNbO_3$ (SLN), stoichiometric $LiTaO_3$ (SLT), RTP ($RbTiOPO_4$), KTA ($KTiOAsO_4$), RTA ($RbTiOAsO_4$), CTA ($CsTiOAsO_4$).

Preferably, the optically nonlinear crystal is suitable for doubling the frequency of the radiation passing through it.

Apart from the frequency conversion crystals mentioned here, however, other crystals or materials which are suitable for frequency conversion can also be arranged alternatively or additionally in the resonator of the laser.

In accordance with at least one embodiment of the optoelectronic semiconductor component, the laser resonator has a length of at most 10 mm.

In accordance with at least one embodiment of the optoelectronic semiconductor component, the laser resonator has a length of at most 5 mm.

In accordance with at least one embodiment of the optoelectronic semiconductor component, the laser resonator has a length of at most 0.25 mm.

Such short resonator lengths permit particularly high modulation frequencies of greater than ten MHz without a resonator-external modulation device being required. Such high modulation frequencies prove in particular to be particularly advantageous if the optoelectronic semiconductor component is used in an optical projection apparatus—for example a laser projector—in which a projected image is generated by means of the so-called "flying spot" technique.

In accordance with at least one embodiment of the optoelectronic semiconductor component, the pump source has an etched laser facet. The etched facet then forms a mirror for a laser resonator of the pump source. The facet is preferably embodied as a retroreflector. Such etched laser facets are described in the document WO2005/048423, for example, the disclosure content of which with regard to the etched laser facets is hereby incorporated by reference.

BRIEF DESCRIPTION OF THE DRAWINGS

The semiconductor component described here is explained in more detail below on the basis of exemplary embodiments and the associated figures.

In the exemplary embodiments and figures, identical or identically acting constituent parts are in each case provided with the same reference symbols. The elements illustrated should not be regarded as true to scale; rather individual elements may be illustrated with an exaggerated size in order to afford a better understanding.

DETAILED DESCRIPTION OF THE DRAWINGS

Figure 1:
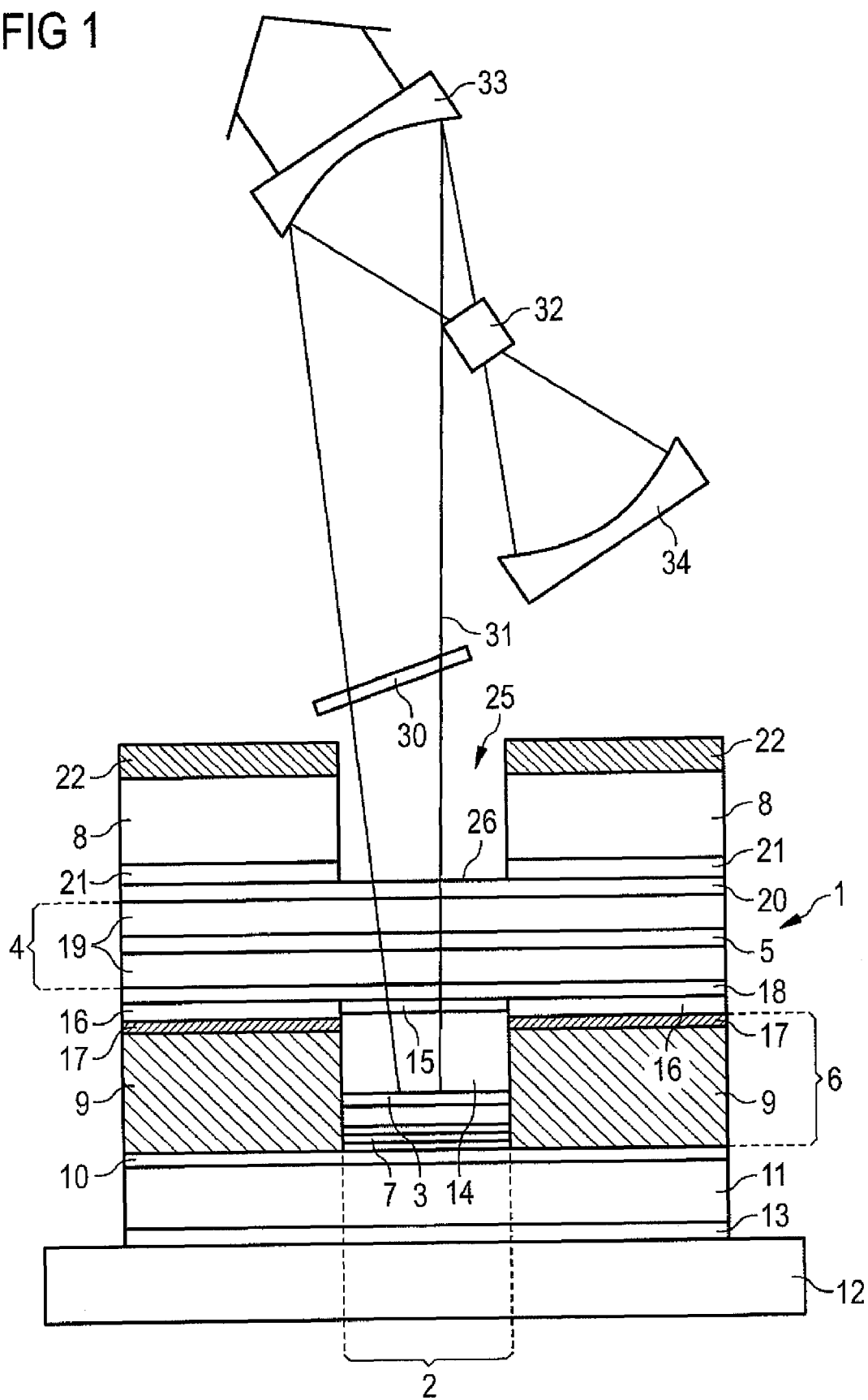
FIG. 1 shows a schematic sectional illustration of an optoelectronic semiconductor component described here in accordance with a first exemplary embodiment.

FIG. 1 shows a schematic sectional illustration of a first exemplary embodiment of an optoelectronic semiconductor component described here.

The semiconductor component comprises a semiconductor body 1. The semiconductor body 1 comprises a growth substrate 8. The growth substrate 8 is an n-doped GaAs substrate, for example. The growth substrate 8 is preferably thinned. That is to say that the thickness of the growth substrate 8 is preferably reduced after the conclusion of the epitaxial growth. In this case, it is also possible for the growth substrate 8 to be completely removed.

Preferably the thickness of the growth substrate 8 is between 100 and 200 micrometers.

In the exemplary embodiment of the semiconductor component described in conjunction with FIG. 1, an opening 25 is introduced into the growth substrate 8. The opening 25 can be produced by etching, for example. The radiation passage area 26 of the semiconductor body 1 is uncovered in the opening 25. The growth substrate 8 is preferably completely removed in the region of the opening 25.

The growth substrate 8 is succeeded by the pump source 4 and also the vertical emitter region 2. Pump source 4 and vertical emitter region 2 are successively deposited epitaxially onto the growth substrate 8 and thus jointly integrated monolithically into the semiconductor body 1.

The vertical emitter region 2 comprises a first mirror 7. The first mirror 7 is preferably a Bragg mirror structure. As an alternative, the first mirror 7 can also be embodied as a metal mirror or dielectric mirror or as a combination of at least two of the three types of mirror mentioned. The first mirror 7 is particularly preferably a Bragg mirror structure that is free of a doping material. By comparison with a doped mirror, in the case of a Bragg mirror structure that is free of doping material, the absorption of free charge carriers from the vertical emitter layer 3 of the vertical emitter region 2 is advantageously reduced.

The first mirror 7 preferably forms a resonator mirror for the electromagnetic radiation generated in the vertical emitter layer 3.

Electromagnetic radiation 31, for example infrared, visible or ultraviolet radiation, is emitted from the vertical emitter layer 3 during operation of the semiconductor component. The vertical emitter layer 3 preferably contains a III-V compound semiconductor material, in particular $In_xAl_yGa_{1-x-y}N$, $In_xAl_yGa_{1-x-y}P$ or $In_xAl_yGa_{1-x-y}As$ where $0 \leq x \leq 1$, $0 \leq y \leq 1$ and $x+y \leq 1$.

Furthermore, it is possible for the vertical emitter layer 3 to contain a II-VI compound semiconductor material such as, for example, ZnSe or ZnO.

The vertical emitter layer 3 is formed for example as a single heterostructure, double heterostructure, single quantum well structure or particularly preferably as a multiple quantum well structure.

Preferably, the quantum well structures of the vertical emitter layer 3 are suitable for absorbing electromagnetic radiation generated in the pump source 4. That is to say that pump radiation is preferably not absorbed in additional barrier layers arranged in the vertical emitter region 2, rather the pump radiation is absorbed in the quantum well structures of the vertical emitter layer 3 and excites the generation of electromagnetic radiation 31 there.

In the direction toward the radiation passage area 26 of the semiconductor body 1, a vertical waveguide layer 14 succeeds the vertical emitter layer 3 in the vertical emitter region 2. Preferably, the thickness of the waveguide layer 14 is chosen to be relatively thick with a layer thickness of at most 30 micrometers. Particularly preferably, the layer thickness of the waveguide layer 14 is between half a micrometer and five micrometers. In the exemplary embodiment, the layer thickness of the waveguide layer 14 is approximately 1.5 micrometers. Preferably, the waveguide layer 14 contains aluminum gallium arsenide wherein the aluminum concentration is approximately six percent. The waveguide layer 14 is provided for expanding the pump radiation generated in the pump source 4. That is to say that the pump radiation is preferably guided by the refractive index profile of the waveguide layer 14 into the vertical emitter layer 3, where the pump radiation is at least partly absorbed and utilized for generating radiation.

In the direction toward the radiation passage area 26 of the semiconductor body 1, at least one etching stop layer 15 succeeds the waveguide layer 14. The etching stop layer 15 forms a selective etching stop layer, on the one hand. By means of the etching stop layer 15 it is possible to uncover a highly doped contact layer 18 of the pump source 4 and in this way to produce a mesa 6 comprising for example the first mirror 7, the vertical emitter layer 3 and also the waveguide layer 14. On the other hand, the etching stop layer 15 serves for improving the coupling of pump radiation from the pump source into the vertical emitter layer 3.

In the direction toward the radiation passage area 26 of the semiconductor body 1, the highly doped contact layer 18 succeeds the etching stop layer 15. The highly doped contact layer 18 enables a quasi-ohmic contact with low contact and series resistance for making contact with the pump source 4. Preferably, the contact layer 18 has a smallest possible layer thickness. The highly doped contact layer 18 is doped for example with a p-type dopant and has a dopant concentration of at least $10^{19}$ cm$^{-3}$. Preferably, the contact layer 18 is arranged in the node of the optical standing wave field of the electromagnetic radiation 31 generated in the vertical emitter layer 3. This advantageously reduces possible loss mechanisms—such as, for example, the absorption of free charge carriers in the highly doped contact layer 18.

For making contact with the pump source 4, the highly doped contact layer 18 is preferably contact-connected by means of a transparent contact layer 16, which can contain for example ZnO, ITO or some other TCO material (TCO—transparent conductive oxide) or consists of one of these materials. Furthermore, the transition region from the vertical emitter region 2 to the pump source 4 can comprise further layers.

By way of example, a plurality of layers having a high aluminum concentration can be arranged between the highly doped contact layer 18 and the transparent contact layer 16. By way of example, said layers are $Al_xGa_{1-x}As$ layers that are locally oxidized. The layers containing a high aluminum concentration are preferably patterned laterally by etching and locally oxidized in part. A particularly good wave guiding of the pump radiation can be achieved in these locally oxidized $Al_xO_y$ regions where x is for example greater than or equal to 0.98. The oxidation of the layers containing a high aluminum concentration in partial regions leads to a relatively large refractive index change of approximately 1.4 and enables locally a considerable optical wave guiding of the pump light in the vertical direction. The layers containing the high aluminum concentration are not oxidized in the vertical emitter region 2. In this case, the refractive index difference is relatively small having a value of approximately 0.13, such that the pump wave propagates in the region toward the vertical emitter layer 3 and can be absorbed there in the quantum well structures.

In contrast to the electrically insulating $Al_xO_y$ regions, electrically conductive contacts to the pump source 4 are produced in the non-oxidized regions by means of etching trenches. A contact-connection can be effected by means of a transparent contact layer 16 or a contact layer which for example contains AuZn or consists of AuZn.

As an alternative, the layers containing a high aluminium concentration can also be omitted. In this case, the transparent contact layer 16 is applied to the highly doped contact layer 18 over the largest possible area. Preferably, the contact layer 16 contains or consists of a transparent conductive oxide (TCO) such as, for example, a ZnO or ITO. Preferably, the contact layer 16 has a low refractive index—relative to the semiconductor material of the pump source 4—of between approximately 1.7 and 2.2. By way of example, ZnO has a refractive index of approximately 1.85 and ITO has a refractive index of approximately 2.0.

Such a low refractive index and the associated high refractive index difference with respect to the adjoining semiconductor layers advantageously enable particularly good wave guiding of the pump radiation in the pump source 4. In order to improve the electrical contact between pump source 4 and transparent contact layer 16, a thin metal layer that is preferably a few monolayers thick, in a preferred manner approximately one monolayer thick, can be arranged between the highly doped contact layer 18 and the transparent contact layer 16. Preferably, said metal layer contains or consists of one of the following metals: chromium, platinum, gold, titanium, silver.

As an alternative to the embodiment of the optoelectronic semiconductor component as described in conjunction with FIG. 1, it is also possible to dispense with the transparent contact layer 16 and also the highly doped contact layer 18. In this case, by means of selective two-step epitaxy, a doped waveguide layer having a relatively small refractive index is applied on the pump source 4. Said layer then consists for example of aluminum gallium arsenide having an aluminum proportion of approximately 45 percent and has a doping atom concentration of $1*10^{17}$ to $20*10^{17}$ cm$^{-3}$. The layer thickness of the waveguide layer is preferably approximately 600 nanometers. A highly doped covering layer, which can consist for example of gallium arsenide having a dopant concentration of $1*10^{20}$ cm$^{-3}$, is then applied to said layer having a relatively small refractive index. A metal layer can be applied to the covering layer, and forms an ohmic contact.

In the direction toward the radiation passage area 26 of the semiconductor body 1, the pump source 4 succeeds the highly doped contact layer 18. The pump source 4 comprises cladding layers 19 and also a pump layer 5. The pump source 4 preferably forms an edge emitting laser. For this purpose, the side areas of the semiconductor body 1 are provided, at least in the region of the pump source 4, with a—for example dielectric—coating formed such that it is highly reflective for the pump radiation.

The pump layer 5 preferably comprises a pn junction provided for generating radiation by means of electrical pumping. The cladding layers 19 of the pump source 4 are formed for example from doped aluminium gallium arsenide having an aluminum concentration of approximately 20 percent and have a thickness of approximately two micrometers.

The etching stop layer 20 succeeds the pump source 4 in the direction of the radiation passage area 26 of the semiconductor body 1. The etching stop layer 20 enables defined etching of the opening 25 through which the electromagnetic radiation 31 generated in the vertical emitter layer 3 can leave the semiconductor body 1 in a manner particularly free of losses. Furthermore, the etching stop layer 20 preferably also forms a wave-guiding layer having a small refractive index for the pump radiation of the pump source 4. In addition, the etching stop layer 20 preferably has a large band gap. In this way, the charge carrier confinement in the pump source 4 is improved by the etching stop layer 20. By way of example, the etching stop layer 20 is formed by a gallium indium phosphide layer having a thickness of approximately 460 nanometers.

In the exemplary embodiment of the optoelectronic semiconductor component as described in conjunction with FIG. 1, a waveguide layer 21 succeeds the etching stop layer 20. Preferably, the waveguide layer 21 is n-doped. The waveguide layer 21 has a dopant concentration of $10^{17}$ cm$^{-3}$, for example. The waveguide layer 21 is formed for example by an aluminum gallium arsenide layer having a thickness of approximately 1000 nanometers and having an aluminum proportion of 45 percent.

The growth substrate 8 is disposed downstream of the waveguide layer 21. Preferably, the growth substrate 8 is thinned and has a thickness of between 100 and 200 micrometers, preferably approximately 150 micrometers. The growth substrate is formed for example by n-doped gallium arsenide having a dopant concentration of approximately $2*18^{18}$ cm$^{-3}$.

A contact metallization 22, which, by way of example, can contain gold or consist of gold, is applied to the growth substrate 8. The contact metallization 22 has a layer thickness of approximately 200 nanometers.

The semiconductor body 1 is applied to a heat spreader 11 by its side remote from the radiation passage area 26. By way of example, the semiconductor body 1 can be applied to the heat spreader 11 by means of a solder layer 10 containing tin, for example. The thickness of the solder layer 10 is preferably approximately two micrometers. The heat spreader 11 is for example a carrier containing a material having good thermal conductivity such as copper or a ceramic material.

The region between transparent contact layer 16, mesa 6 and heat spreader 11 is preferably filled with a material 9. The material 9 is a material that conducts current and heat particularly well. The material 9 is preferably a metal.

The material 9 is applied to the semiconductor body in the vicinity of the mesa, that is to say to the highly doped contact layer 18 and the side areas of the mesa that delimit the mesa.

The material 9 is preferably silver or gold electrodeposition layers. In this case, silver and/or gold is suitable on account of its good thermal and electrical conductivity. Preferably, the material 9 is applied to the semiconductor body 1 by means of a low-temperature galvanic process.

The comparatively low process temperature during the electromagnetic deposition of approximately between 20 and 100 degrees Celsius is advantageous in particular since the semiconductor material on which the semiconductor body 1 is based and the material 9 have different coefficients of thermal expansion. This is the case for example for a semiconductor layer sequence based on arsenide compound semiconductors, such as GaAs, for example, which has a coefficient of thermal expansion of approximately $6*10^{-6}$ $K^{-1}$, to which a gold layer is applied electrolytically, which has a coefficient of thermal expansion of approximately $14*10^{-6}$ $K^{-1}$.

In the exemplary embodiment of the optoelectronic semiconductor component as described in conjunction with FIG. 1, the heat spreader 11 is mounted onto a carrier 12 by its side remote from the semiconductor body 1. In this case, the heat spreader 11 is mechanically and electrically connected to the carrier 12 by means of a solder layer 13. The solder layer 13 consists of tin, for example, and has a thickness of approximately two micrometers. The carrier 12 can be for example a connection carrier such as a metal-core circuit board, for instance, by means of which electrical contact can be made with the pump source 4.

An optical element 30 is disposed downstream of the radiation passage area 26 of the semiconductor body 1. The optical element 30 is for example a frequency-selective optical element that enables a narrowband monomode operation of the semiconductor component. A frequency-selective element 30 is for example an etalon and/or a birefringent filter.

Furthermore, the semiconductor component comprises a folding mirror 33 which together with the resonator mirror 34 forms an external cavity in which an optically nonlinear crystal 32 is arranged. The frequency converting crystal 32 is preferably suitable for doubling the frequency of the electromagnetic radiation passing through it. The folding mirror 33 is formed such that it is highly reflective for electromagnetic radiation 31 of the fundamental wavelength that is generated in the vertical emitter layer 3. At least a large portion of the frequency-converted radiation is transmitted by the folding mirror 33.

Furthermore, further optical elements can be arranged in the laser resonator, such as, for example, mode coupling optical elements, phase compensating optical elements, optically imaging elements such as lenses, in particular Fresnel lenses, and/or components with modulation capability. These optical elements can in part also be applied directly to the semiconductor body (1) or be integrated monolithically with the semiconductor body (1).

Figure 2:
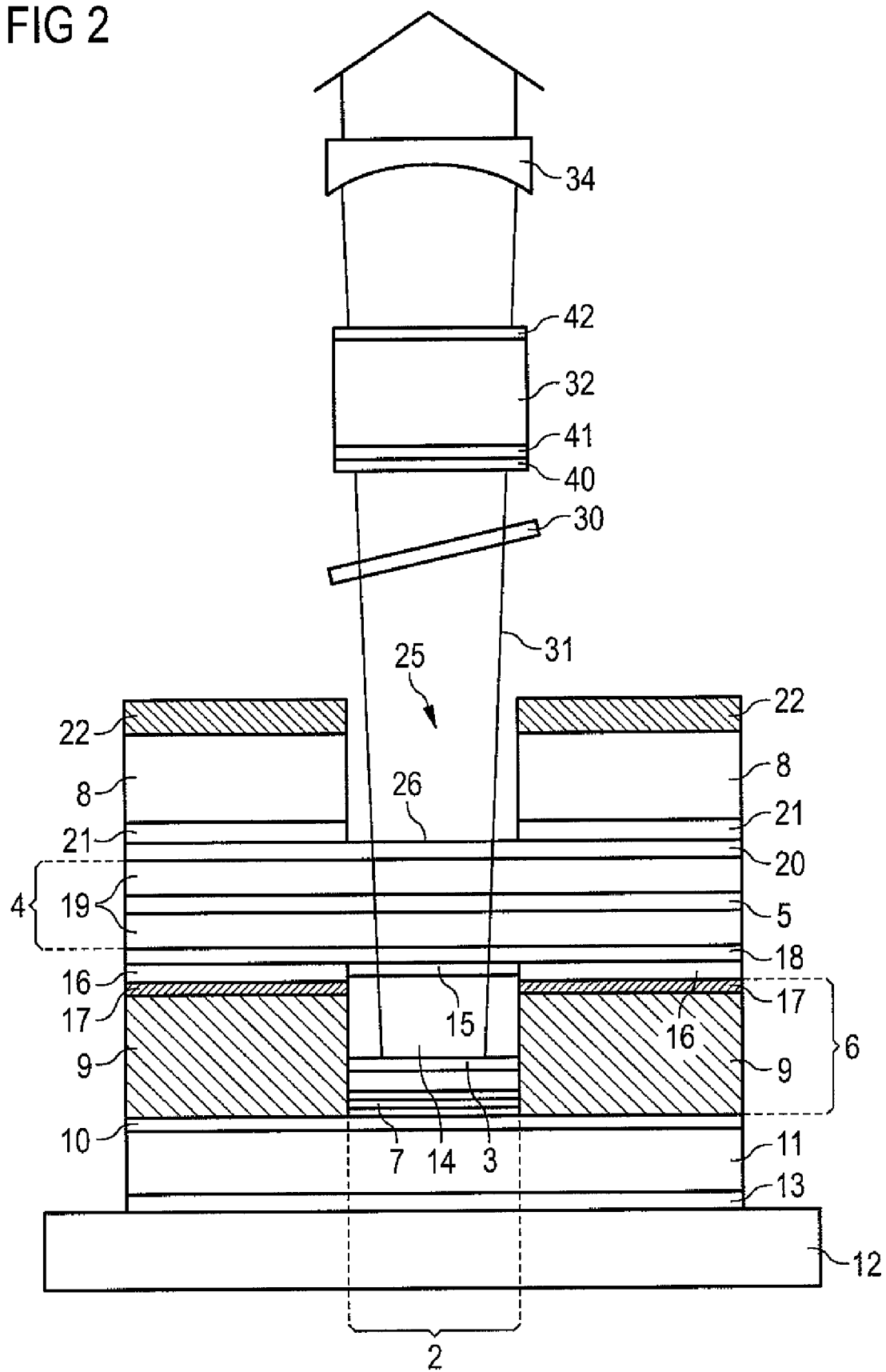
FIG. 2 shows a schematic sectional illustration of an optoelectronic semiconductor component described here in accordance with a second exemplary embodiment.

FIG. 2 shows a schematic sectional illustration of a second exemplary embodiment of an optoelectronic semiconductor component described here. In contrast to the exemplary embodiment described in conjunction with FIG. 1, a folding mirror is dispensed with in the exemplary embodiment in FIG. 2. The frequency-converting crystal 32 has a coating 41 on its radiation passage area facing the radiation passage area 26, said coating being highly reflective for frequency-converted radiation. A further coating 40, which is embodied in antireflective fashion for radiation 31 of the fundamental wavelength, is applied to the coating 41.

A coating 42 embodied in antireflective fashion for radiation of the fundamental wavelength is applied on that radiation passage area of the optically nonlinear crystal 32 which is remote from the radiation passage area 26 of the semiconductor body 1. The resonator mirror 34 is formed such that it is reflective for radiation of the fundamental wavelength, and the resonator mirror is transmissive for frequency-converted radiation.

Figure 3:
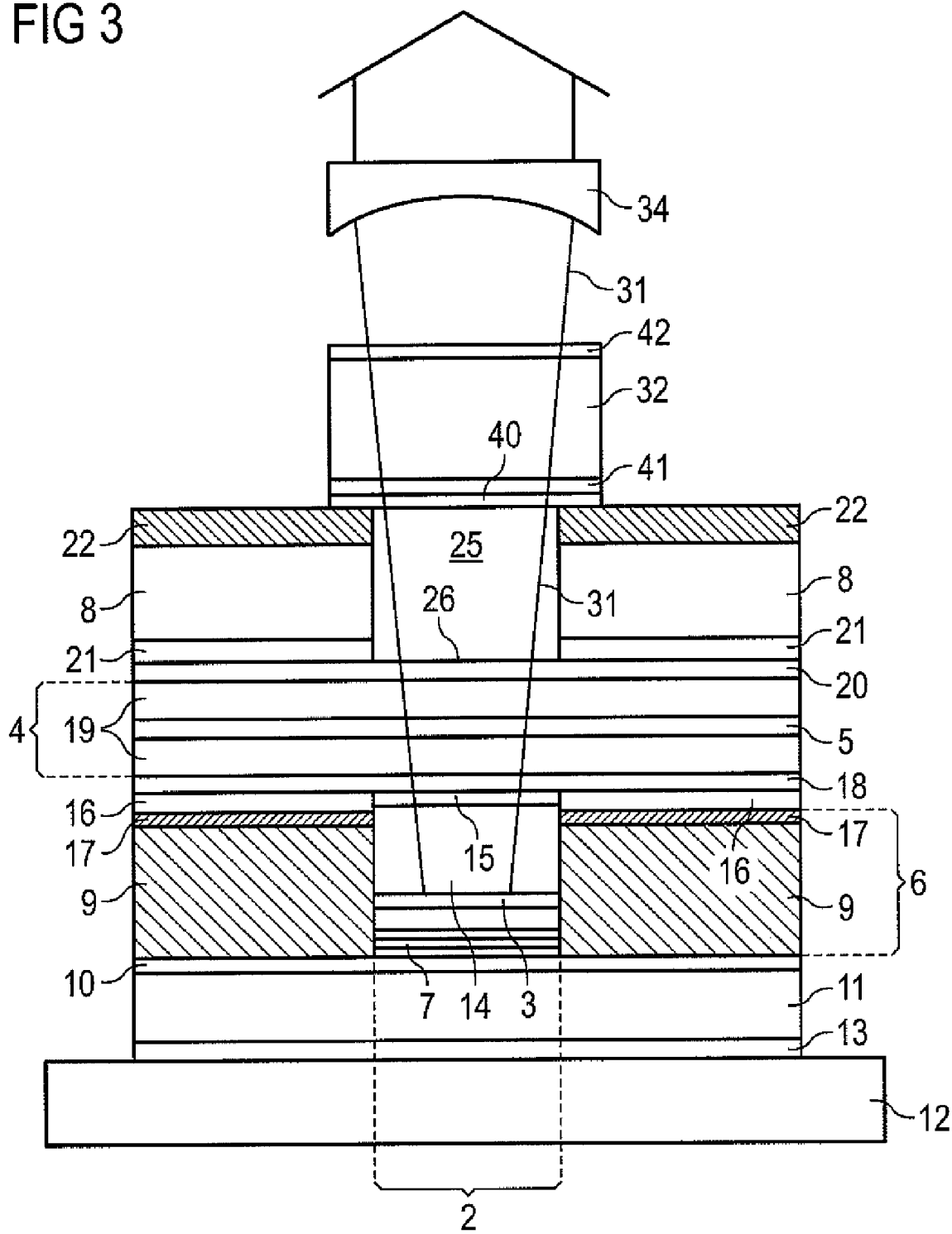
FIG. 3 shows a schematic sectional illustration of an optoelectronic semiconductor component described here in accordance with a third exemplary embodiment.

A third exemplary embodiment of an optoelectronic semiconductor component described here is described in conjunction with FIG. 3. In contrast to the exemplary embodiment described in conjunction with FIG. 2, the optically nonlinear crystal 32 here is mounted directly onto the semiconductor body 1. In this way, a particularly compact laser module is realized in which resonator lengths of less than or equal to ten millimeters are possible. Such short resonator lengths permit particularly high modulation frequencies of greater than ten MHz, without a resonator-external modulation device being required.

Figure 4:
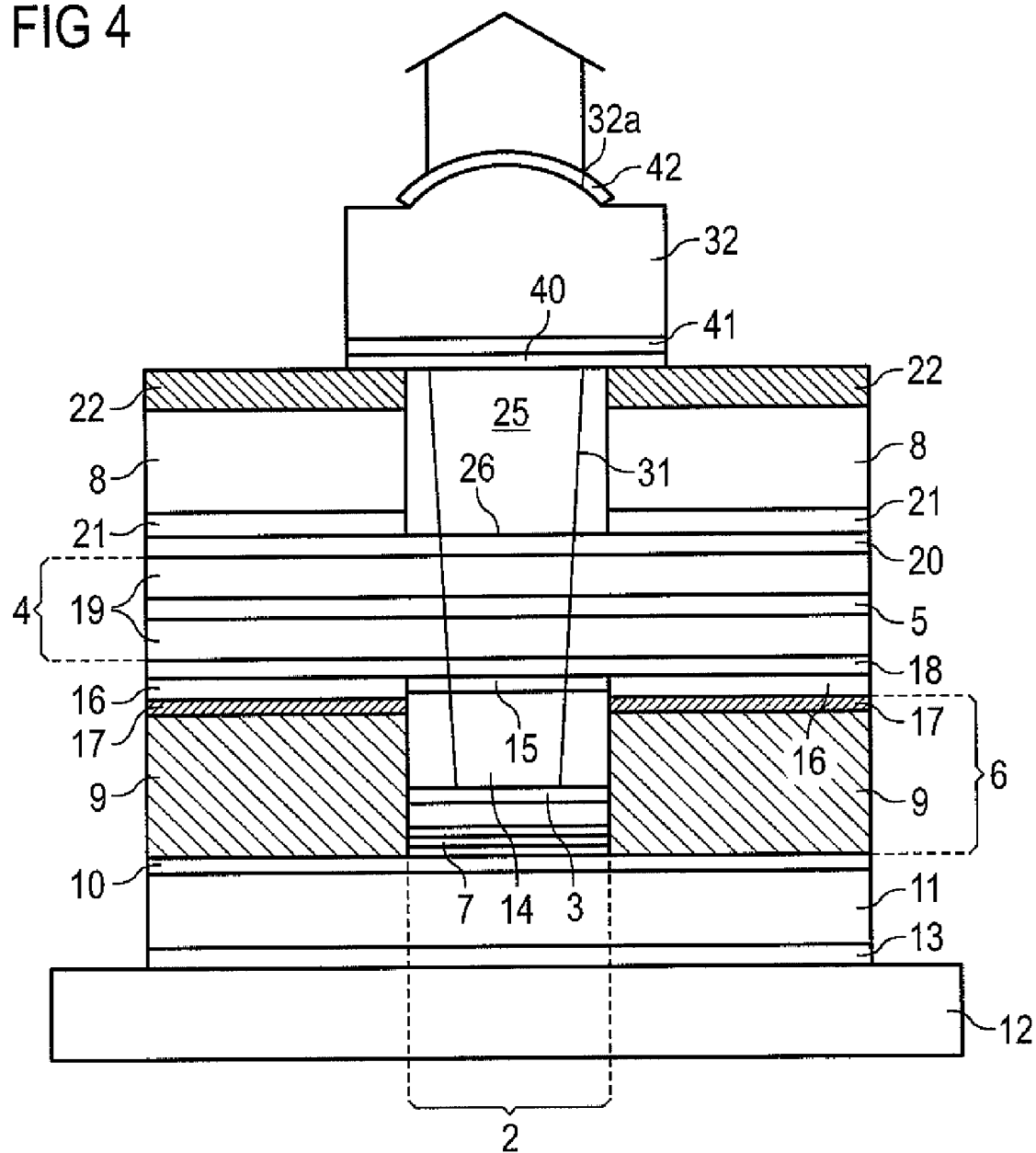
FIG. 4 shows a schematic sectional illustration of an optoelectronic semiconductor component described here in accordance with a fourth exemplary embodiment.

FIG. 4 shows a schematic sectional illustration of a fourth exemplary embodiment of the optoelectronic semiconductor component described here. In order to enable a further miniaturization relative to the exemplary embodiment described in conjunction with FIG. 3, the external resonator mirror 34 is replaced in this exemplary embodiment by a curved radiation passage area 32a of the frequency-converting crystal 32. For this purpose, that radiation passage area of the optically nonlinear crystal 32 which is remote from the semiconductor body 1 is provided with a coating 42 that is antireflective for frequency-converted radiation and highly reflective for radiation of the fundamental wavelength.

Figure 5:
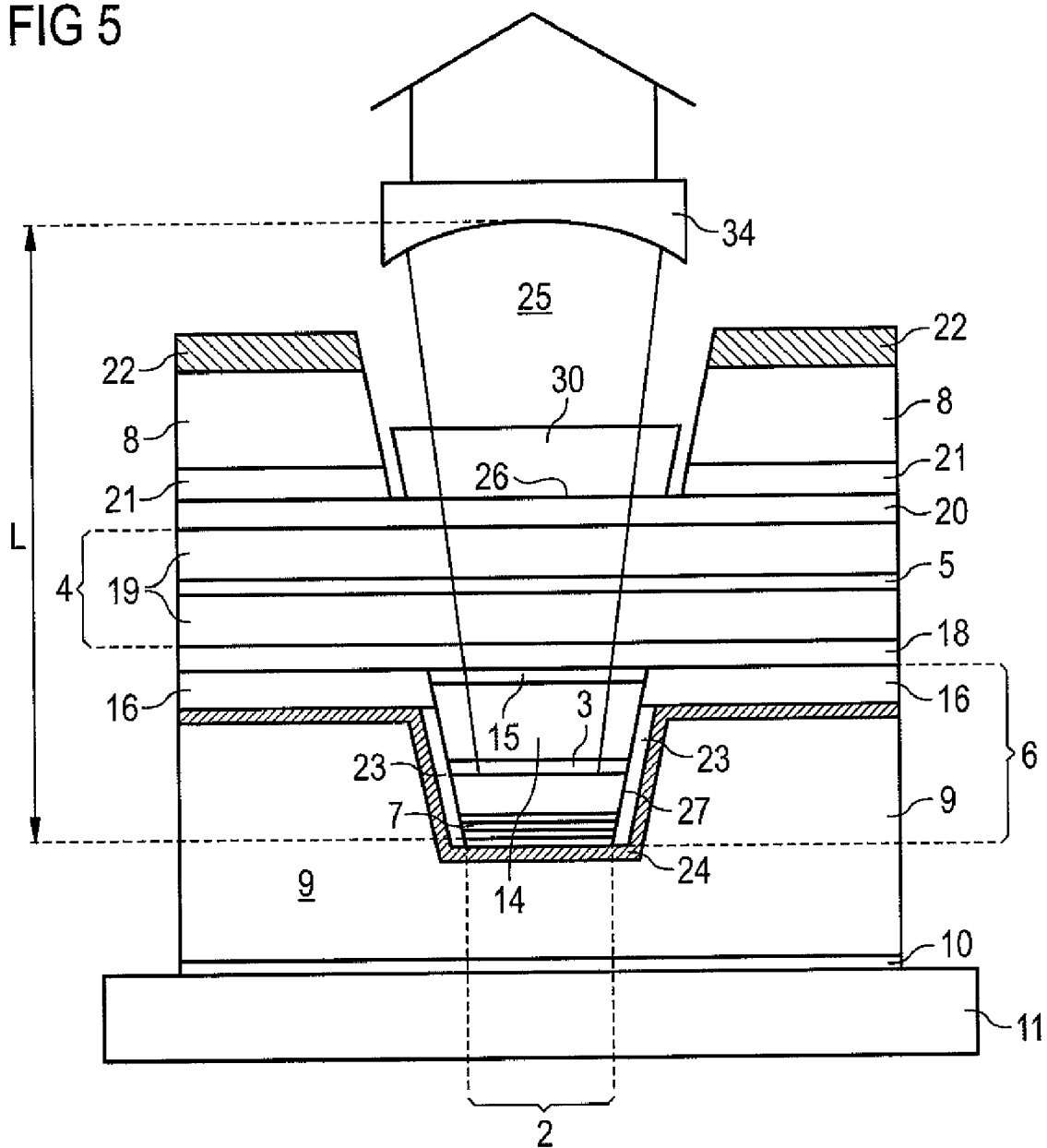
FIG. 5 shows a schematic sectional illustration of an optoelectronic semiconductor component described here in accordance with a fifth exemplary embodiment.

FIG. 5 shows a schematic sectional illustration of a fifth exemplary embodiment of an optoelectronic semiconductor component described here. In contrast to the exemplary embodiments described in conjunction with FIGS. 1 to 4, the mesa 6 is formed in a truncated-cone-like manner in this exemplary embodiment. That is to say that the side areas 27 delimiting the mesa are bevelled and form an angle of greater than 0 degrees with the surface normal to the vertical emitter layer 3, for example. In this case, the side areas 27 are formed such that they are reflective for pump radiation generated in the pump source 4. For this purpose, side areas 27 of the mesa 6 are coated with a passivation layer 23, which, by way of example, can contain a silicon nitride or consists of silicone nitride. A layer 24 that is reflective for the pump radiation is applied to the passivation layer 23. The reflective layer 24 preferably has a reflectivity of greater than or equal to 80 percent for the pump radiation. By way of example, the reflective layer 24 contains or consists of AuZn. The mesa 6 coated in this way is completely enclosed by the material 9. This permits a particularly good thermal coupling of the semiconductor body 1 to a heat spreader 11.

An optical element 30 is applied to the radiation passage area 26 of the semiconductor body 1, said optical element additionally functioning as a heat spreader. The optical element 30 reduces the thermal resistance of the radiation passage area by approximately eight kelvins per watt. In addition, the optical element 30 serves for example as an etalon for the electromagnetic radiation generated in the vertical emitter layer 3 and thereby enables a spectral constriction of the radiation circulating in the laser resonator. Overall, the optical element 30 thereby enables an as far as possible temperature-independent fixing of the laser wavelength. Preferably, the optical element 30 is fixed on the radiation passage area 26 by means of capillary bonding or some other connecting technique.

The optical element 30 preferably consists of silicon carbide or diamond.

The arrangement of the optical element on the radiation passage area 26 furthermore permits a particularly small resonator length L. In particular, resonator lengths of less than 10 mm can be realized.

Figure 6:
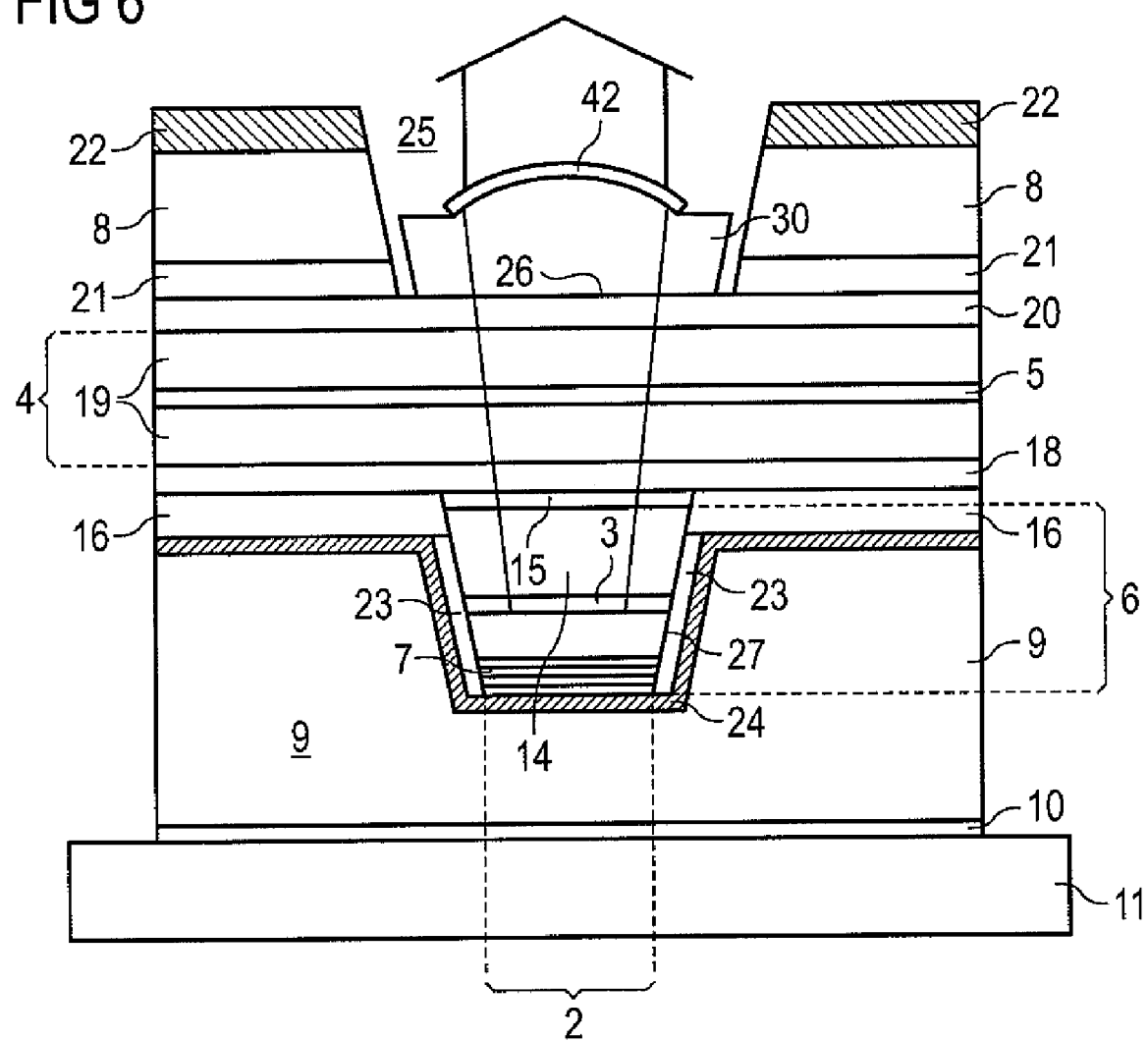
FIG. 6 shows a schematic sectional illustration of an optoelectronic semiconductor component described here in accordance with a sixth exemplary embodiment.

FIG. 6 shows a schematic sectional illustration of a sixth exemplary embodiment of an optoelectronic semiconductor component described here. In contrast to the exemplary embodiment of the component as described in conjunction with FIG. 5, the optical element here has a curved radiation passage area provided with a coating 42 that is reflective for the electromagnetic radiation of the fundamental wavelength. By way of example, a laser that is as compact as possible and may be suitable for generating infrared radiation is realized in this way.

Figure 7:
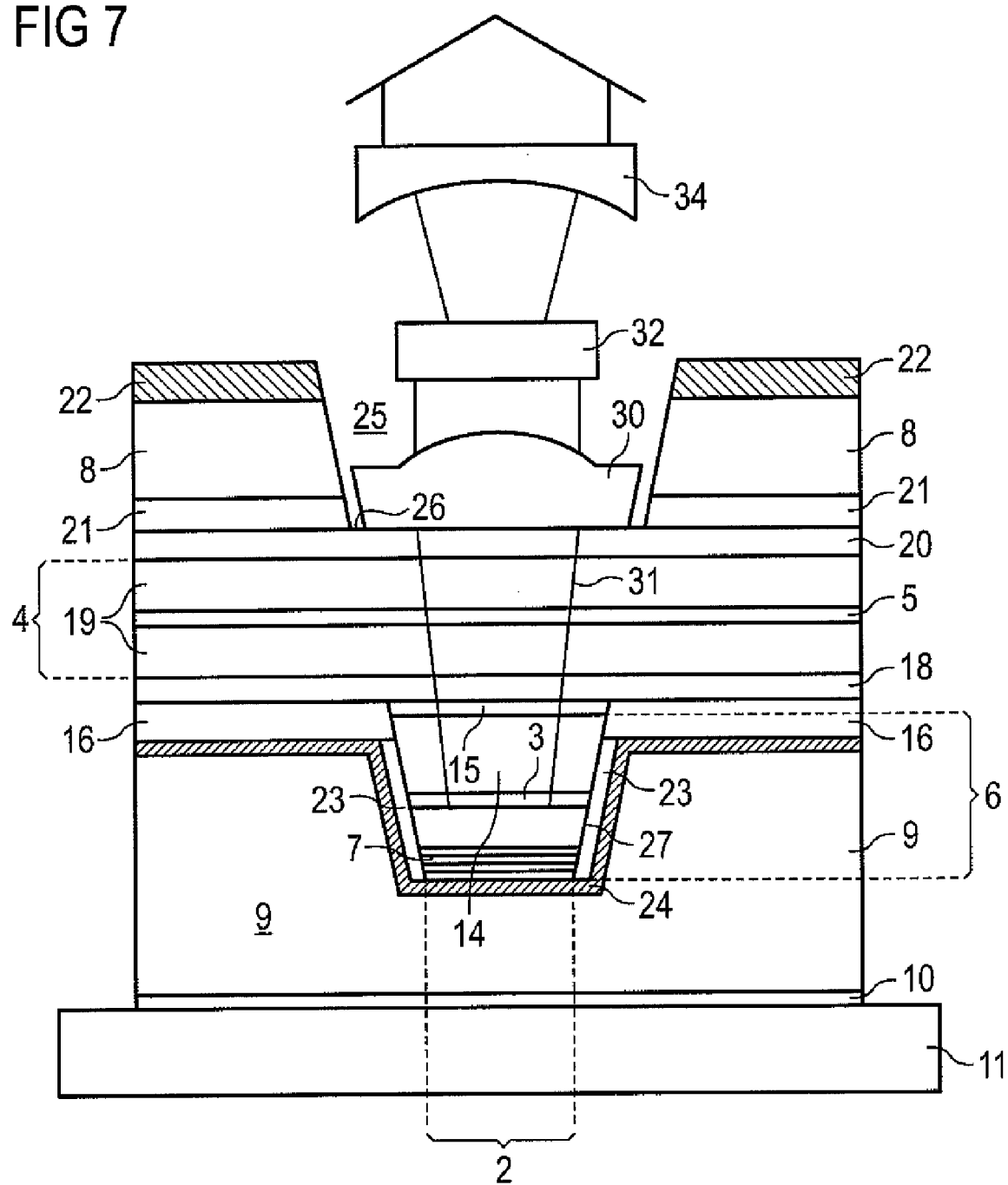
FIG. 7 shows a schematic sectional illustration of an optoelectronic semiconductor component described here in accordance with a seventh exemplary embodiment.

A seventh exemplary embodiment of an optoelectronic semiconductor component described here is described in conjunction with FIG. 7. In this exemplary embodiment, an optically nonlinear crystal 32 is disposed downstream of the optical element 30 in the laser resonator. The optical element 30 serves here as a microlens on account of the radiation passage area curved away convexly from the radiation passage area 26 of the semiconductor body 1, said microlens serving for focusing the electromagnetic radiation of the fundamental wavelength into the optically nonlinear crystal 32. Particularly high power densities can thus be achieved during the frequency conversion. This enables efficient frequency doubling at a high modulation frequency.

Figure 8:
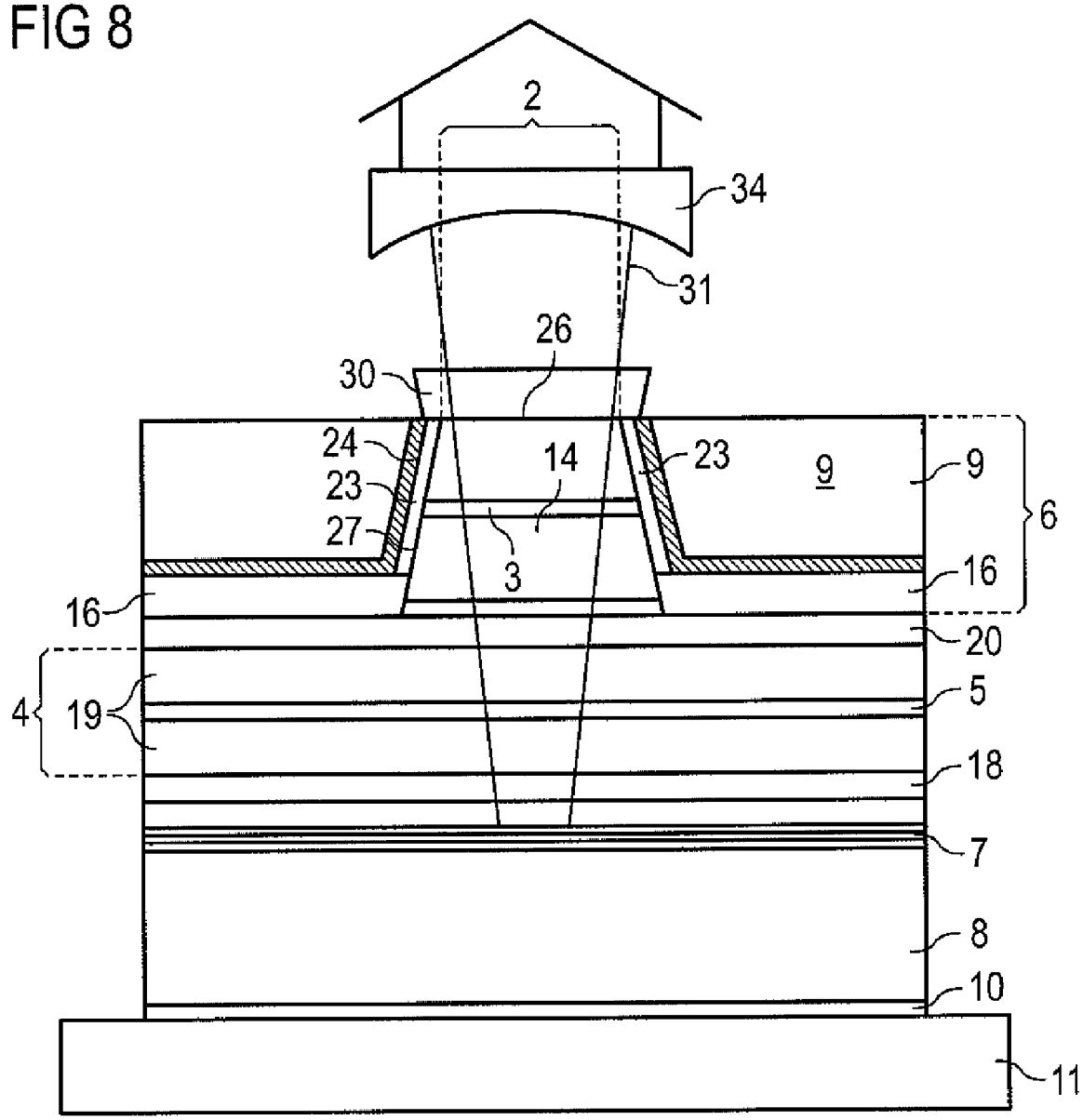
FIG. 8 shows a schematic sectional illustration of an optoelectronic semiconductor component described here in accordance with an eighth exemplary embodiment.

An eighth exemplary embodiment of an optoelectronic semiconductor component described here is described in conjunction with FIG. 8. In contrast for example to the exemplary embodiment described in conjunction with FIG. 5, in this exemplary embodiment the vertical emitter layer 2 is arranged between the pump source 4 and the radiation passage area 26. That is to say that the vertical emitter layer 2 succeeds the pump source 4 in the emission direction of the electromagnetic radiation 31 generated in the vertical emitter layer 3. Preferably, the Bragg mirror structure 7 is doped in this exemplary embodiment in order to enable contact to be made with the pump source 4. An arrangement of the vertical emitter region 2 between the pump source 4 and the radiation passage area 26 is also possible in the exemplary embodiments described in conjunction with FIGS. 1 to 7.

Overall, owing to the relatively short resonator length L, the optoelectronic semiconductor component described here is particularly well suited to laser projectors in which imaging is effected by means of flying spot technology.

FIGS. 9A to 9F show schematic plan views of various exemplary embodiments of the semiconductor body 1 of the optoelectronic semiconductor component described here.

The pump sources have laser facets 40 embodied as highly reflective mirrors. By way of example, the mirrors can be produced by scribing, breaking and coating with a highly reflective coating. Moreover, it is possible for the facets 40 to be produced by means of etching. Reflection at the facets can then be effected by means of total reflection and/or on account of a reflective coating.

Figure 9A:
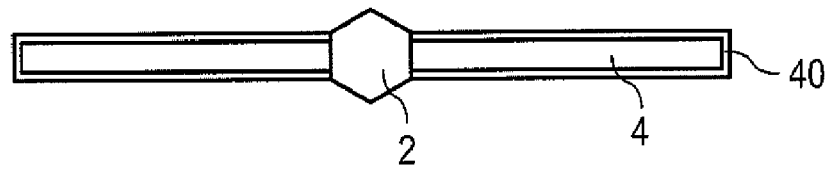
FIGS. 9A, 9B, 9C, 9D, 9E, 9F show schematic plan views of optoelectronic semiconductor components described here in accordance with different exemplary embodiments.

FIG. 9A shows an embodiment with two linear pump sources 4 which are opposite one another and lie laterally adjacent to a central vertical emitter region 2, which is embodied in hexagonal fashion here.

Figure 9B:
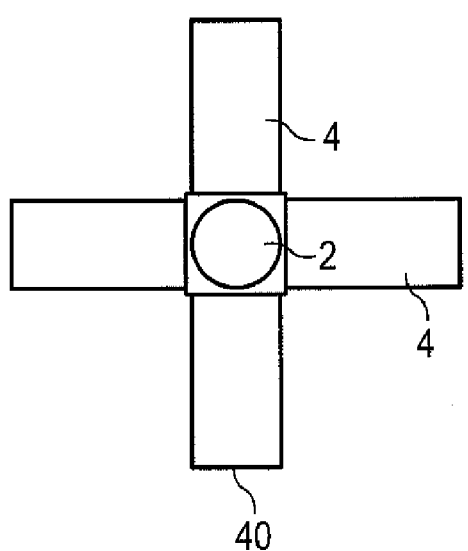

FIG. 9B illustrates an exemplary embodiment in which a beam profile that is as radially symmetrical as possible is achieved in the case of a square vertical emitter region 2. In this case, in the outer region of the vertical emitter region 2, the vertical emitter layer 3 is damaged for example by ion beam bombardment in such a way that it absorbs the pump light of the pump sources 4 with a lower efficiency in this region than in the inner non-damaged region embodied as far as possible in circular fashion.

Figure 9C:
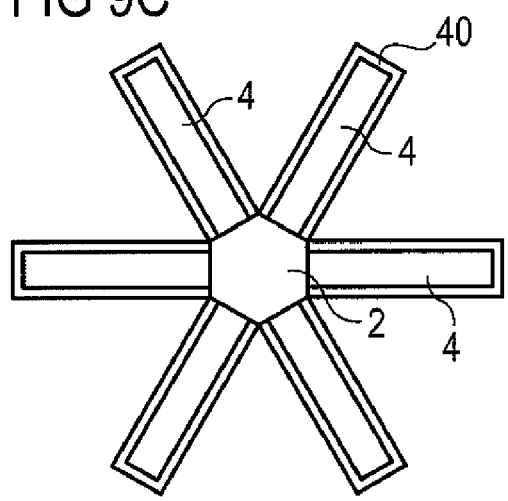
Figure 9D:
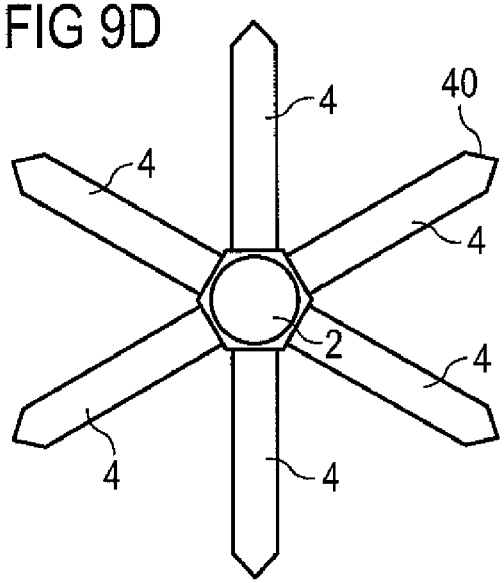
Figure 9E:
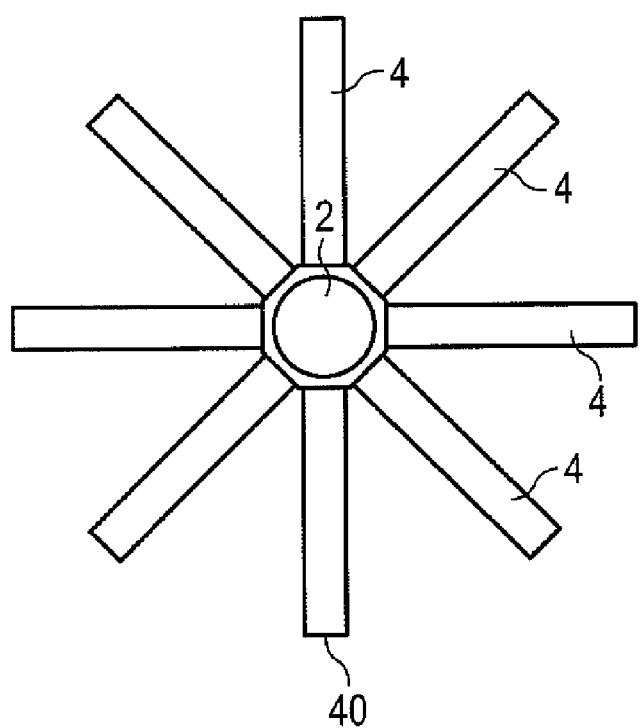

FIGS. 9C, 9D and 9E show embodiments with different numbers of pump sources 4.

In the embodiment described in conjunction with FIG. 9D, the laser facets 40 are embodied as retrorefectors that are arrow-shaped in plan view.

Figure 9F:
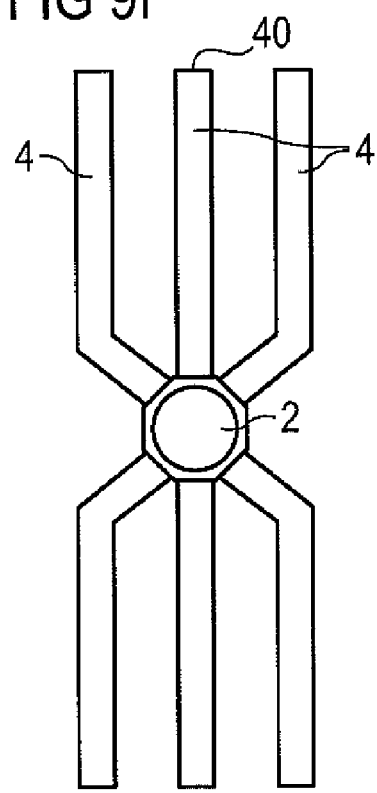

FIG. 9F shows an embodiment with linear pump sources 4 that are arranged in particularly space-saving fashion in a departure from the star-shaped arrangement of the pump sources 4 as described for example in conjunction with FIGS. 9C to 9E.

In the exemplary embodiments described in conjunction with FIGS. 10A to 10D, the pump sources 4 are embodied as ring lasers.

Figure 10A:
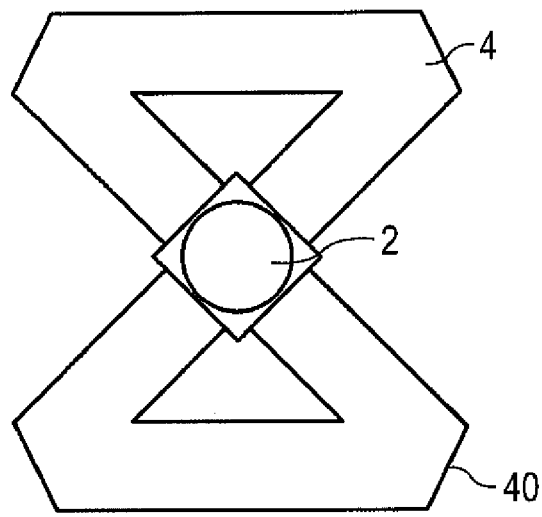
FIGS. 10A, 10B, 10C, 10D show schematic plan views of optoelectronic semiconductor components described here in accordance with different exemplary embodiments.
Figure 10B:
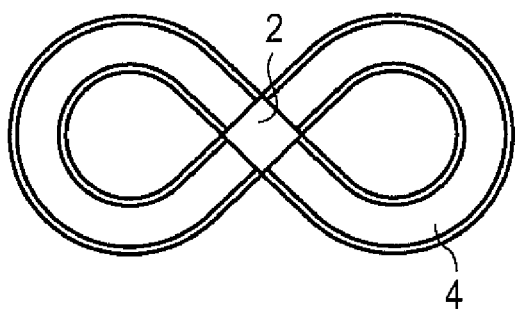
Figure 10C:
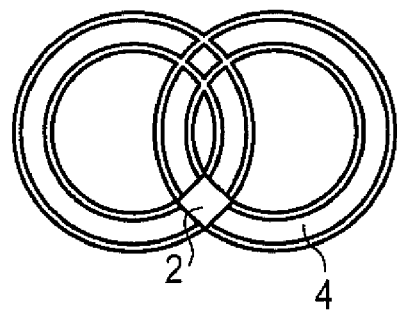

FIGS. 10A, 10B and 10C show arrangements in which the vertical emitter region 2 is designed in each case in square fashion. The pump sources 4 are embodied here as ring lasers.

FIG. 10B schematically illustrates an exemplary embodiment in which a ring laser 4 is present which is wound to form an "eight" at the crossover point of which the vertical emitter region 2 is in turn arranged.

In the exemplary embodiment described in conjunction with FIG. 10C, two pump radiation sources 4 embodied as ring lasers are provided, which overlap in such a way that they cross in the vertical emitter region 2.

The ring laser structures based on wave guiding as specified have the advantage that resonator end mirrors can be dispensed with and possible losses at said resonator end mirrors are obviated.

Figure 10D:
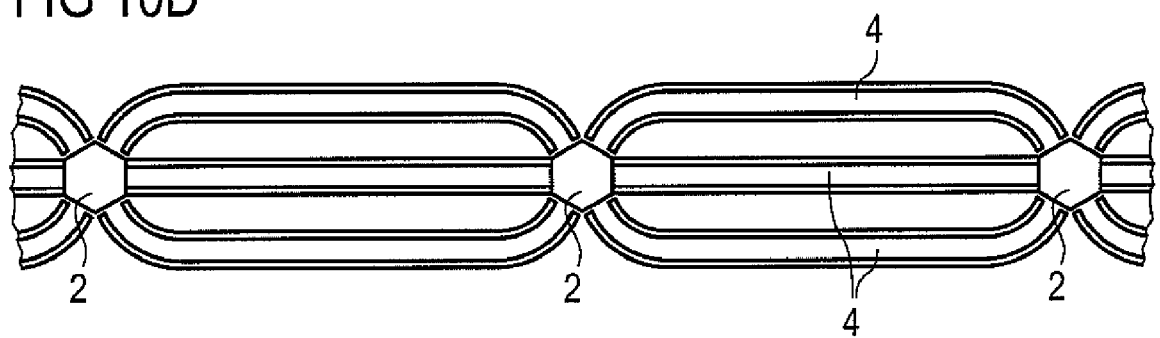

FIG. 10D shows an arrangement in which a plurality of hexagonal vertical emitter regions 2 lying in a row are provided, which are pumped by various linear or else curved pump sources 4.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An optoelectronic semiconductor component having a semiconductor body comprising:
   a surface emitting vertical emitter region comprising a vertical emitter layer;
   at least one pump source provided for optically pumping the vertical emitter layer; and
   a radiation passage area through which electromagnetic radiation generated in the vertical emitter layer leaves the semiconductor body,
   wherein the pump source and the vertical emitter layer are at a distance from one another in a vertical direction, the vertical emitter is arranged in a mesa of the semiconductor body, a material containing a metal is applied to the semiconductor body at least in places in a vicinity of the mesa, the material is applied to the mesa such that the material molds over the mesa, and the material is applied with a thickness to at least a same height as the mesa;
   wherein the semiconductor includes a region outside the mesa having a larger lateral extension than a region inside the mesa; and
   wherein the pump source is arranged in-line between the vertical emitter layer and the radiation passage area and wherein the pump source is an edge emitting laser.

2. The optoelectronic semiconductor component as claimed in claim 1, wherein the pump source is monolithically integrated into the semiconductor body between the vertical emitter layer and the radiation passage area.

3. The optoelectronic semiconductor component as claimed in claim 1, wherein the material is deposited electrolytically in the vicinity of the mesa.

4. The optoelectronic semiconductor component as claimed in 1, wherein a side area that delimits the mesa is formed in a reflective manner for pump radiation.

5. The optoelectronic semiconductor component as claimed in claim 4, wherein the side area of the mesa is coated at least in places with a material having a reflectivity for pump radiation of at least 80 percent.

6. The optoelectronic semiconductor component as claimed in claim 4, wherein the side area of the mesa is formed at least in places in the manner of one of the following optical basic elements: truncated-cone optical unit, truncated-pyramid optical unit, compound parabolic concentrator (CPC), compound hyperbolic concentrator (CHC) and compound elliptic concentrator (CEC).

7. The optoelectronic semiconductor component as claimed in claim 4, wherein the side area of the mesa is provided at least in places so as to direct pump radiation to the vertical emitter layer.

8. The optoelectronic semiconductor component as claimed in claim 1, wherein the surface emitting vertical emitter region comprises a Bragg mirror structure that is free of doping material.

9. The optoelectronic semiconductor component as claimed in claim 8, wherein the Bragg mirror structure is arranged on that side of the vertical emitter layer which is remote from the at least one pump source.

10. The optoelectronic semiconductor component as claimed in claim 8, wherein the optoelectronic semiconductor component comprises at least one mirror which, together with the Bragg mirror structure, forms a laser resonator for electromagnetic radiation generated in the vertical emitter layer.

11. The optoelectronic semiconductor component as claimed in claim 10, wherein at least one optical element, which is in thermal contact with the semiconductor body of the optoelectronic semiconductor component, is arranged in the laser resonator.

12. The optoelectronic semiconductor component as claimed in claim 11, wherein the at least one optical element has at least one of the following optical properties: frequency-selective, frequency-multiplying, reflective and optically refractive.

13. The optoelectronic semiconductor component as claimed in claim 12, wherein the optical element is formed at least in places by one of the following optical basic elements: etalon, birefringent filter, optically nonlinear crystal, mirror and lens.

14. The optoelectronic semiconductor component as claimed in claim 1, wherein the pump source is electrically contact-connected by a transparent contact layer.

15. The optoelectronic semiconductor component as claimed in claim 14, wherein the transparent contact layer contains at least one of the following materials: Zinc oxide (ZnO) and Indium tin oxide (ITO).

* * * * *

UNITED STATES PATENT AND TRADEMARK OFFICE
CERTIFICATE OF CORRECTION

PATENT NO. : 8,351,479 B2
APPLICATION NO. : 12/293057
DATED : January 8, 2013
INVENTOR(S) : Stephan Lutgen Page 1 of 1

It is certified that error appears in the above-identified patent and that said Letters Patent is hereby corrected as shown below:

Col. 15, lines 1-3 should read as follows:

Claim 4. The optoelectronic semiconductor component as claimed in <u>claim</u> 1, wherein a side area that delimits the mesa is formed in a reflective manner for pump radiation.

Signed and Sealed this
Nineteenth Day of March, 2013

Teresa Stanek Rea
*Acting Director of the United States Patent and Trademark Office*